United States Patent
Yoshimoto et al.

(10) Patent No.: US 12,251,923 B2
(45) Date of Patent: Mar. 18, 2025

(54) JOINED BODY, HOLDING DEVICE, AND ELECTROSTATIC CHUCK

(71) Applicant: NGK SPARK PLUG CO., LTD., Nagoya (JP)

(72) Inventors: Osamu Yoshimoto, Nagoya (JP); Ryuichi Arakawa, Nagoya (JP); Tomoo Tanaka, Nagoya (JP)

(73) Assignee: NITERRA CO., LTD., Nagoya (JP)

( * ) Notice: Subject to any disclaimer, the term of this patent is extended or adjusted under 35 U.S.C. 154(b) by 150 days.

(21) Appl. No.: 18/043,218

(22) PCT Filed: Jun. 25, 2021

(86) PCT No.: PCT/JP2021/024112
§ 371 (c)(1),
(2) Date: Feb. 27, 2023

(87) PCT Pub. No.: WO2022/049878
PCT Pub. Date: Mar. 10, 2022

(65) Prior Publication Data
US 2023/0311451 A1    Oct. 5, 2023

(30) Foreign Application Priority Data
Sep. 2, 2020    (JP) .................. 2020-147280

(51) Int. Cl.
*H01T 23/00*    (2006.01)
*B23K 1/00*    (2006.01)
(Continued)

(52) U.S. Cl.
CPC ............ *B32B 9/041* (2013.01); *B23K 1/0016* (2013.01); *B23K 35/0233* (2013.01);
(Continued)

(58) Field of Classification Search
None
See application file for complete search history.

(56) References Cited

U.S. PATENT DOCUMENTS 4,251,709 A * 2/1981 Schumacher .......... B23K 31/02
219/121.64
5,100,048 A * 3/1992 Timsit .................. B23K 35/286
228/198

(Continued)

FOREIGN PATENT DOCUMENTS

JP    S55-93230 A    7/1980
JP    H03-003249 A    1/1991
(Continued)

OTHER PUBLICATIONS

Japan Patent Office, International Search Report issued in corresponding Application No. PCT/JP2021/024112, mailed Aug. 3, 2021.
China National Intellectual Property Administration, Notification of First Office Action Issued in Corresponding Application No. 202180018306.8 Dated Feb. 18, 2023.

*Primary Examiner* — Stephen W Jackson
(74) *Attorney, Agent, or Firm* — Stites & Harbison, PLLC; Jeffrey A. Haeberlin

(57) ABSTRACT

A joining layer of a joined body includes a joining material which contains, as a main component, a metal having a surface tension of 1000 mN/m or less at its melting point, and a metal layer which has a plurality of pores formed therein and in which at least some of the pores are impregnated with the joining material.

20 Claims, 9 Drawing Sheets

(51) Int. Cl.
- *B23K 35/02* (2006.01)
- *B23K 35/26* (2006.01)
- *B32B 7/12* (2006.01)
- *B32B 9/00* (2006.01)
- *B32B 9/04* (2006.01)
- *B32B 15/02* (2006.01)
- *B32B 15/20* (2006.01)
- *C04B 37/02* (2006.01)
- *H01L 21/683* (2006.01)

(52) U.S. Cl.
CPC ............... *B23K 35/26* (2013.01); *B32B 7/12* (2013.01); *B32B 9/005* (2013.01); *B32B 15/02* (2013.01); *B32B 15/20* (2013.01); *C04B 37/023* (2013.01); *B32B 2457/00* (2013.01); *C04B 2237/12* (2013.01); *C04B 2237/402* (2013.01); *C04B 2237/403* (2013.01); *C04B 2237/407* (2013.01); *C04B 2237/408* (2013.01); *C04B 2237/62* (2013.01); *C04B 2237/706* (2013.01); *H01L 21/6833* (2013.01)

(56) References Cited

U.S. PATENT DOCUMENTS

| | | |
|---|---|---|
| 5,886,863 A | 3/1999 | Nagasaki et al. |
| 6,280,584 B1 | 8/2001 | Kumar et al. |
| 2002/0139563 A1 | 10/2002 | Fujii et al. |
| 2004/0195092 A1* | 10/2004 | D'Astolfo, Jr. ......... C25C 7/025 |
| | | 204/280 |
| 2004/0209108 A1 | 10/2004 | Fujii et al. |

FOREIGN PATENT DOCUMENTS

| JP | H07-263527 A | 10/1995 |
|---|---|---|
| JP | 2002-293655 A | 10/2002 |
| JP | 3485390 | 1/2004 |
| JP | 2010-052015 A | 3/2010 |
| JP | 2010-179313 A | 8/2010 |
| JP | 2018006737 A | 1/2018 |
| JP | 2020-047747 A | 3/2020 |

* cited by examiner

[Fig.1]
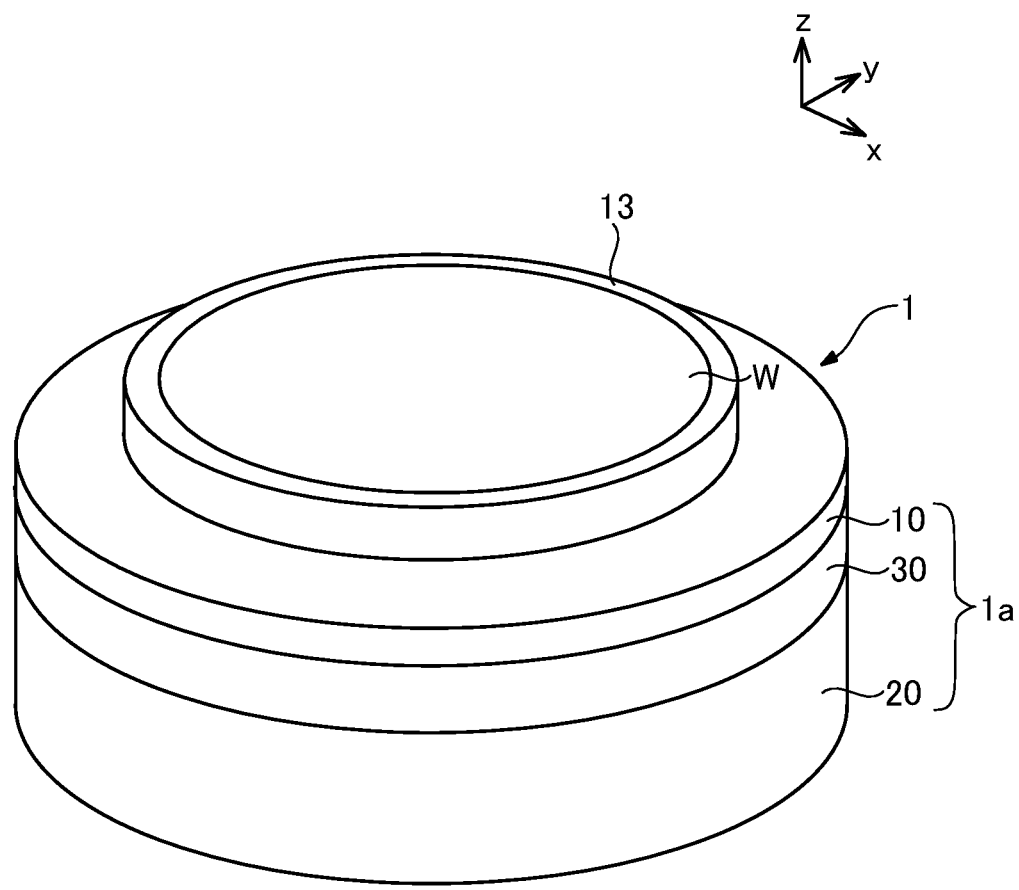

[Fig.2]
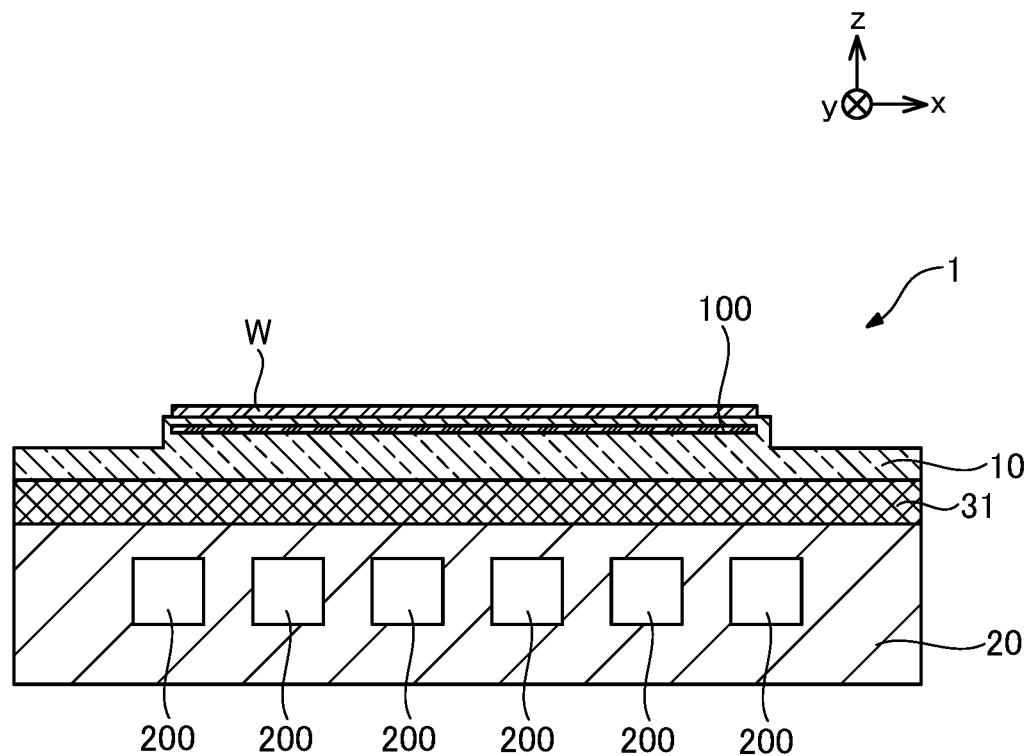

[Fig.3]
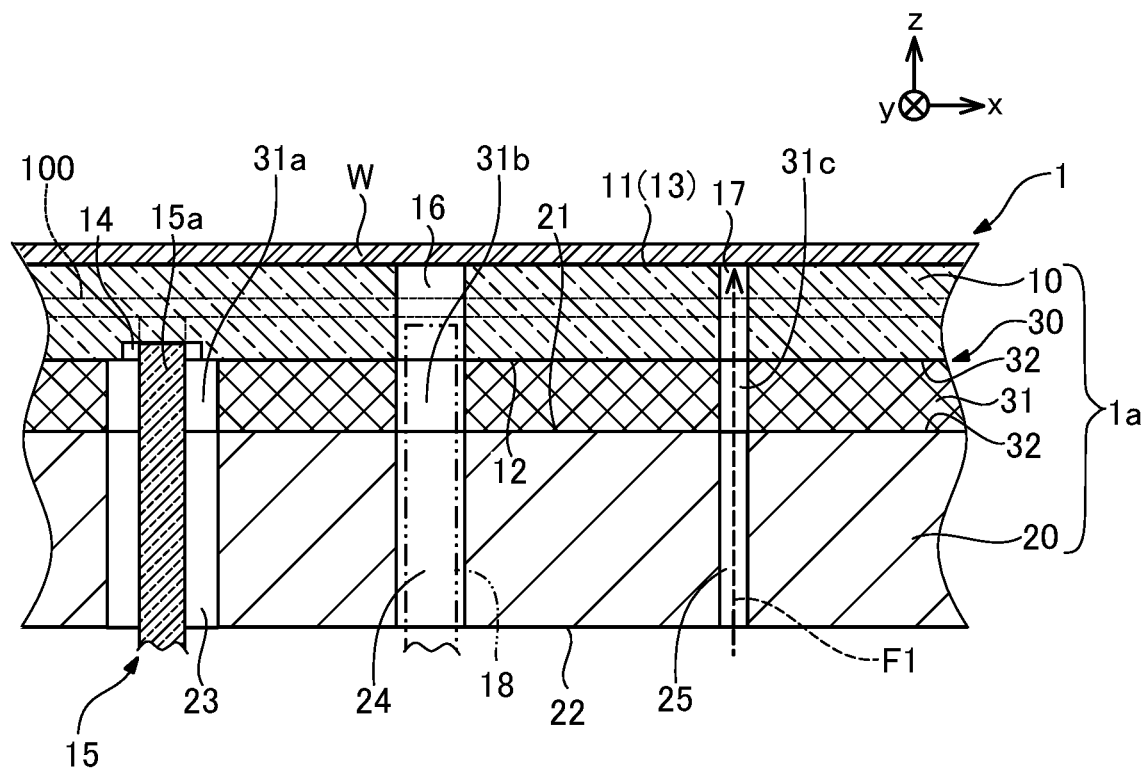

[Fig.4]
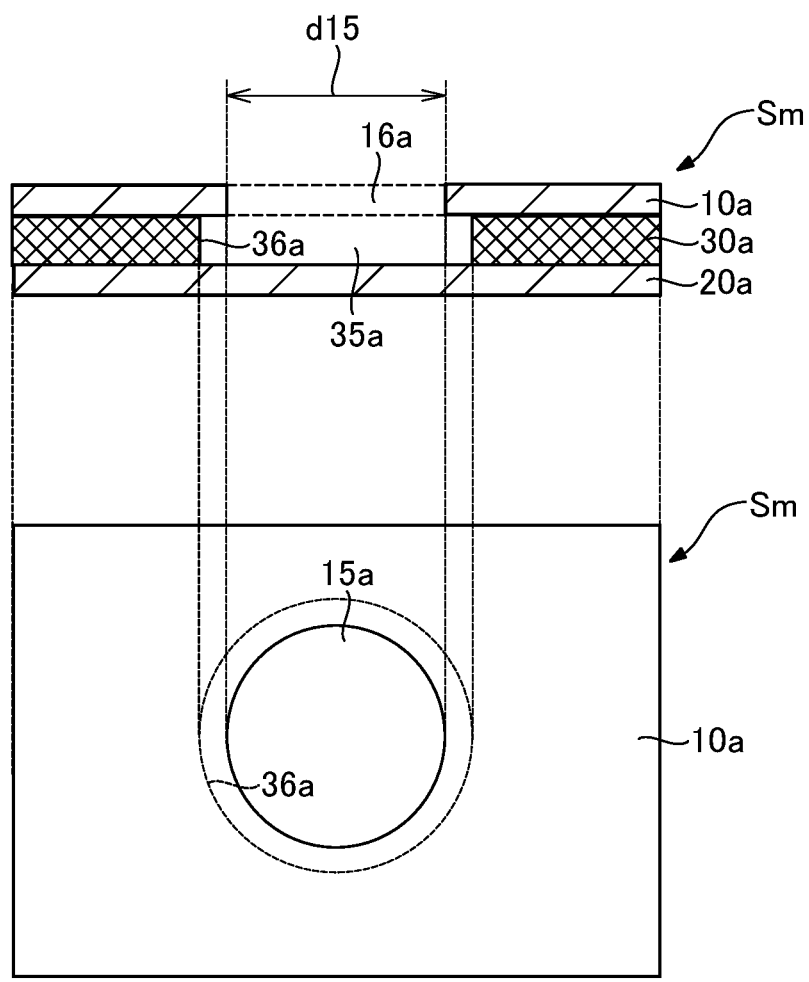

[Fig.5]
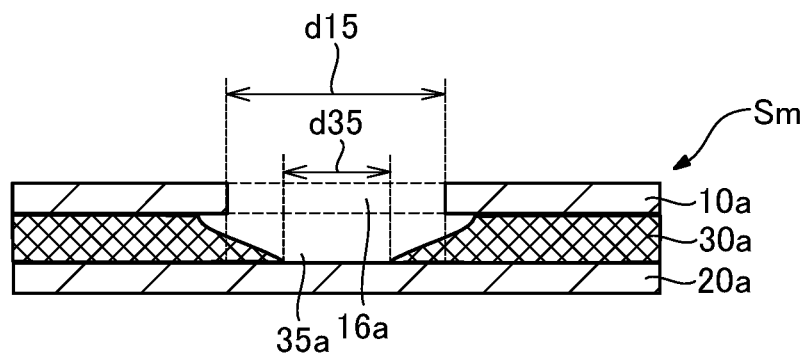

[Fig.6]
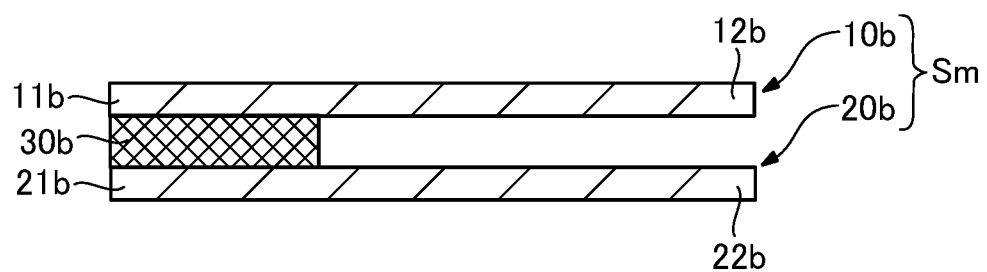

[Fig.7]
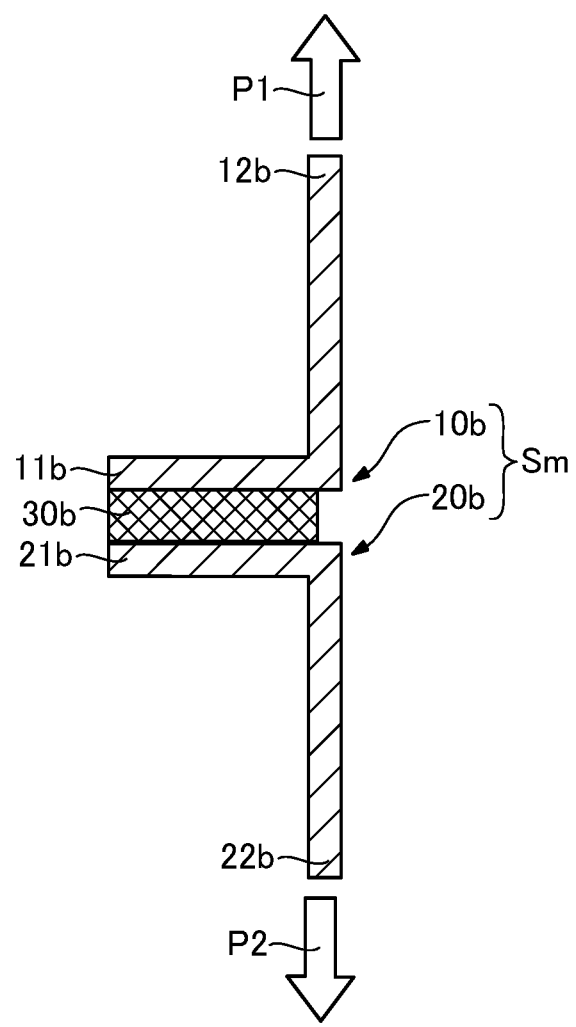

[Fig.8]

| Sample No | Brazing filler metal | Metal layer | Mesh interval (micrometers) | Wire diameter (micrometers) | Material (wire material) | Weaving method | Oozing out | Joint strength |
|---|---|---|---|---|---|---|---|---|
| Sample1 | In | Not provided | — | — | — | — | X | X |
| Sample2 | In | Perforated metal | — | — | SUS | — | B | B− |
| Sample3 | In | Welded mesh | 500 | 200 | SUS | — | B | B− |
| Sample4 | In | Welded mesh | 500 | 200 | Al | — | B | A |
| Sample5 | In | Welded mesh | 500 | 200 | Ti | — | B | A |
| Sample6 | In | Welded mesh | 500 | 200 | Mo | — | A | B− |
| Sample7 | In | Welded mesh | 500 | 200 | W | — | A | B− |
| Sample8 | In | Welded mesh | 500 | 200 | Ag | — | B | A |
| Sample9 | In | Welded mesh Ag plating | 500 | 200 | SUS | — | B | A |
| Sample10 | In | Welded mesh Au plating | 500 | 200 | SUS | — | B | A |
| Sample11 | In | Welded mesh Cu plating | 500 | 200 | SUS | — | B | A |
| Sample12 | In | Woven mesh | 500 | 200 | SUS | Plain weave | B | B+ |
| Sample13 | In | Woven mesh | 500 | 200 | SUS | Twill weave | B | B+ |
| Sample14 | In | Woven mesh | 500 | 200 | SUS | Dutch weave | B | B+ |

[Fig.9]

| Sample No | Brazing filler metal | Metal layer | Mesh interval (micrometers) | Wire diameter (micrometers) | Material (wire material) | Weaving method | Oozing out | Joint strength |
|---|---|---|---|---|---|---|---|---|
| Sample15 | In | Woven mesh | 500 | 200 | Mo | Plain weave | A | B+ |
| Sample16 | In | Woven mesh Ag plating | 500 | 200 | Mo | Plain weave | A | A |
| Sample17 | In | Woven mesh Au plating | 500 | 200 | Mo | Plain weave | A | A |
| Sample18 | In | Woven mesh Cu plating | 500 | 200 | Mo | Plain weave | A | A |
| Sample19 | In | Woven mesh Ag plating | 50 | 200 | Mo | Plain weave | A | B+ |
| Sample20 | In | Woven mesh Ag plating | 70 | 200 | Mo | Plain weave | A | A |
| Sample21 | In | Woven mesh Ag plating | 100 | 200 | Mo | Plain weave | A | A |
| Sample22 | In | Woven mesh Ag plating | 1000 | 200 | Mo | Plain weave | A | A |
| Sample23 | In | Woven mesh Ag plating | 1500 | 200 | Mo | Plain weave | A | A |
| Sample24 | In | Woven mesh Ag plating | 1700 | 200 | Mo | Plain weave | A | B+ |
| Sample25 | In | Woven mesh Ag plating | 500 | 30 | Mo | Plain weave | A | B+ |
| Sample26 | In | Woven mesh Ag plating | 500 | 50 | Mo | Plain weave | A | A |
| Sample27 | In | Woven mesh Ag plating | 500 | 150 | Mo | Plain weave | A | A |
| Sample28 | In | Woven mesh Ag plating | 500 | 400 | Mo | Plain weave | A | A |
| Sample29 | In | Woven mesh Ag plating | 500 | 450 | Mo | Plain weave | A | B+ |
| Sample30 | In | Woven mesh Ag plating | 500 | 200 | W | Plain weave | A | A |
| Sample31 | SnAgCu | Woven mesh Ag plating | 500 | 200 | Mo | Plain weave | A | A |
| Sample32 | PbSn | Woven mesh Ag plating | 500 | 200 | Mo | Plain weave | A | A |

JOINED BODY, HOLDING DEVICE, AND ELECTROSTATIC CHUCK

BACKGROUND OF THE INVENTION

1. Field of the Invention

The present invention relates to a joined body, a holding apparatus, and an electrostatic chuck.

2. Description of Related Art

Heretofore, there has been known a joined body in which two members are joined together by a joining layer including a joining material. In general, when two members are joined together by using a joining material containing a metal whose surface tension is small, the joining material can be spread over wide regions of joint interfaces between the joining layer and the two members. For example, Patent Documents 1 and 2 disclose a technique of joining two members by using a joining material which contains, as a main component, indium whose surface tension is relatively small. Also, Patent Document 3 discloses a joined body which includes a joining layer containing fibers which are higher in thermal conductivity than the joining material. Also, Patent Document 4 discloses a holding apparatus which includes a joining layer having a mesh member whose thermal conductivity is high.

Patent Document 1 is Japanese Patent No. 3485390.
Patent Document 2 is Japanese Patent Application Laid-Open (kokai) No. H3-3249.
Patent Document 3 is Japanese Patent Application Laid-Open (kokai) No. 2020-47747.
Patent Document 4 is Japanese Patent Application Laid-Open (kokai) No. H7-263527.

BRIEF SUMMARY OF THE INVENTION

However, the prior art techniques still have room for improvement regarding a technique for suppressing a decrease in joint strength by suppressing oozing of the joining material from between the two members in the joined body. For example, in the case of the technique disclosed in Patent Documents 1 and 2, since the flowability of the joining material containing indium is high, the joining material may ooze from between the two members. Therefore, the strength of joint between the two members may decrease. In the case of the technique disclosed in Patent Document 3, since flow of the joining material in the joining layer is hindered by fibers, in some cases, voids are generated at the joint interfaces between the joining layer and the two members. If voids are generated, the strength of joint between the two members by the joining layer may decrease. In the case of the technique disclosed in Patent Document 4, since flow of the joining material is hindered by the mesh member, there is a possibility that voids are generated at the joint interfaces between the joining layer and the two members, and the strength of joint between the two members by the joining layer decreases.

An object of the present invention is to provide a technique for a joined body in which a first member and a second member are joined together by a joining material, the technique suppressing a decrease in joint strength by suppressing oozing of the joining material from between the two members.

The present invention has been accomplished so as to at least partially solve the above-described problem and can be realized in the following aspects.

According to one aspect of the present invention, a joined body in which a first member and a second member are joined together via a joining layer is provided. In this joined body, the joining layer includes a joining material which contains, as a main component, a metal having a surface tension of 1000 mN/m or less at its melting point, and a metal layer which has a plurality of pores formed therein and in which at least some of the pores are impregnated with the joining material.

According to this configuration, at least some pores of the metal layer are impregnated with the joining material which contains, as a main component, a metal whose surface tension is 1000 mN/m or less at its melting point. The main component of the joining material refers to a component which is one of components contained in the joining material and which has a weight ratio of 50% or greater with respect to the overall weight of the joining material. The joining material which contains, as a main component, a metal whose surface tension is 1000 mN/m or less at its melting point has a high degree of flowability when melted. In the joining layer, the joining material enters the pores of the metal layer while spreading over the entire joint interface between the first member and the joining layer and over the entire joint interface between the second member and the joining layer. As a result, the joining material becomes less likely to ooze from between the first member and the second member. Since oozing of the joining material from between the first member and the second member is suppressed, a decrease in the strength of joint between the first member and the second member can be suppressed.

In the joined body of the above-described aspect, the metal layer may be formed of a material which contains molybdenum or tungsten as a main component. According to this configuration, since the degree of thermal expansion of the metal layer formed of a material which contains molybdenum or tungsten as a main component is relatively small, even when the metal layer is heated when the first member and the second member are joined together or the joined body is used, the metal layer deforms to a smaller degree. As a result, oozing of the joining material can be suppressed stably, and, therefore, a decrease in the strength of joint between the first member and the second member can be suppressed further.

In the joined body of the above-described aspect, the metal layer may be formed of a material which contains aluminum or titanium as a main component. According to this configuration, since the metal layer formed of a material which contains aluminum or titanium as a main component has a relatively small Young's modulus, it becomes easier for the metal layer to deform. As a result, when the joined body is cooled, since the metal layer deforms to follow contraction of the joining material, generation of voids can be suppressed. Accordingly, a decrease in the strength of joint between the first member and the second member due to generation of voids can be suppressed.

In the joined body of the above-described aspect, the metal layer may be a mesh member, and surfaces of wires of the mesh member may be formed of a material which contains gold, silver, or copper as a main component. According to this configuration, the surfaces of the wires forming the metal layer, which is a mesh member, are formed of a material which contains gold, silver, or copper as a main component. As a result, the wettability of the joining material with respect to the metal layer is improved.

Therefore, the joining material becomes more likely to spread over the entire joint interface between the first member and the joining layer and over the entire joint interface between the second member and the joining layer, whereby generation of voids is suppressed. Accordingly, a decrease in the strength of joint between the first member and the second member can be suppressed.

In the joined body of the above-described aspect, the metal layer may be a mesh member formed such that a plurality of wires intersect with each other in a plain weave fashion, a twill weave fashion, or a Dutch weave fashion, and portions of each wire which intersect with other wires located adjacent to the wire are not connected to the other wires. According to this configuration, in the mesh member in which portions of each wire which intersect with other wires located adjacent to the wire are not connected to the other wires, the wires move easily as compared with, for example, a perforated metal and a welded mesh, which is formed by weaving a plurality of wires such that the wires intersect with each other but portions of each wire which intersect with other wires located adjacent to the wire are connected to the other wires. Therefore, when the joined body is cooled, the metal layer deforms more easily to follow contraction of the joining material, whereby generation of voids can be suppressed. Accordingly, a decrease in the strength of joint between the first member and the second member due to generation of voids can be suppressed further.

In the joined body of the above-described aspect, the metal layer may be a mesh member, and the mesh member may have a mesh interval of 70 micrometers to 1500 micrometers. According to this configuration, the metal layer, which is a mesh member, has a mesh interval of 70 micrometers to 1500 micrometers. When the mesh interval becomes smaller than 70 micrometers, since it becomes difficult for the joining material entering the pores of the metal layer to move within the metal layer, the joining material becomes less likely to spread over the entire joint interfaces. Also, when the mesh interval becomes larger than 1500 micrometers, voids become more likely to be generated in the joining layer, whereby the strength of joint between the first member and the second member decreases. In the joined body which includes the metal layer having a mesh interval of 70 micrometers to 1500 micrometers, it is possible to suppress a decrease in the joint strength due to generation of voids, while spreading the joining material over the entire joint interface between the first member and the joining layer and over the entire joint interface between the second member and the joining layer. As a result, the strength of joint between the first member and the second member can be increased further.

In the joined body of the above-described aspect, the metal layer may be a mesh member, and wires of the mesh member may have a diameter of 50 micrometers to 400 micrometers. According to this configuration, the wires of the metal layer, which is a mesh member, have a diameter of 50 micrometers to 400 micrometers. When the wire diameter becomes smaller than 50 micrometers, the effect of stopping flow of the joining material by the metal layer becomes weaker, and the joining material becomes more likely to ooze from the pores of the metal layer. Also, when the wire diameter becomes greater than 400 micrometers, the effect of stopping flow of the joining material by the metal layer becomes excessively strong, and the joining material becomes less likely to spread over the entire joint interfaces. In the joining layer which includes the metal layer whose wires have a diameter of 50 micrometers to 400 microm- eters, it is possible to spread the joining material over the entire joint interfaces properly. As a result, it is possible to suppress generation of voids while suppressing oozing of the joining material from between the first member and the second member, thereby further increasing the strength of joint between the first member and the second member.

In the joined body of the above-described aspect, the joining material may contain indium as a main component. According to this configuration, the first member and the second member can be joined together at a relatively low temperature by using the joining material containing indium as a main component for the joining layer. Since the first member and the second member can be joined together at a relatively low temperature, a joined body which is suitable for use at low temperature can be obtained.

According to another aspect of the present invention, a holding apparatus is provided. This holding apparatus includes the above-described joined body, and the first member has a placement surface on which an object to be held is placed. According to this configuration, in the joined body, oozing of the joining material from between the first member and the second member is suppressed by the metal layer, and, therefore, the strength of joint between the first member and the second member can be increased. As a result, in the case where a through hole in which an electrode terminal is disposed is formed in the joined body, it is possible to suppress occurrence of an insulation failure of the electrode terminal, which could otherwise occur as a result of leakage of the joining material into the through hole. Also, in the case where a through hole in which a movable body such as a lift pin is disposed is formed in the joined body, it is possible to suppress occurrence of an operation failure of the movable body, which could otherwise occur as a result of leakage of the joining material into the through hole. Also, in the case where a through hole for supplying a fluid to the placement surface is formed in the joined body, it is possible to suppress clogging of the through hole, which could otherwise occur as a result of leakage of the joining material into the through hole. Since it is possible to suppress occurrence of an insulation failure, occurrence of an operation failure, clogging of the through hole, etc. in the holding apparatus as described above, loss of functions of the holding apparatus can be prevented.

According to still another aspect of the present invention, an electrostatic chuck is provided. This electrostatic chuck includes the above-described holding apparatus, and the first member has an electrostatic attraction electrode disposed therein. According to this configuration, through holes are formed in the joined body; specifically, an electrode through hole in which an electrode terminal electrically connected to an electrostatic attraction electrode is disposed and a lift pin through hole in which a lift pin for lifting a wafer electrostatically attracted by the electrostatic attraction electrode is inserted. In the joined body provided in the above-described holding apparatus, since oozing of the joining material from between the first member and the second member is suppressed by the metal layer, it is possible to suppress occurrence of an insulation failure of the electrode terminal in the electrode through hole and occurrence of an operation failure of the lift pin in the lift pin through hole. Also, it is possible to suppress clogging of the through hole for supplying a fluid to the placement surface, which clogging could otherwise occur as a result of leakage of the joining material into the through hole. Accordingly, loss of functions of the electrostatic chuck can be prevented.

Notably, the present invention can be realized in various modes. For example, the present invention may be realized as an apparatus containing the joined body, a method for manufacturing the joined body and the holding apparatus, etc.

BRIEF DESCRIPTION OF THE DRAWINGS

FIG. 1 is a perspective view showing the appearance of an electrostatic chuck of a first embodiment.

FIG. 2 is an overall sectional view of the electrostatic chuck.

FIG. 3 is a partial sectional view of the electrostatic chuck.

FIG. 4 is a first view used for describing a method for evaluating oozing of a joining material.

FIG. 5 is a second view used for describing the method for evaluating oozing of the joining material.

FIG. 6 is a first view used for describing a method for evaluating the joint strength of a joined body.

FIG. 7 is a second view used for describing the method for evaluating the joint strength of the joined body.

FIG. 8 is a first table used for describing the results of a test for evaluating the joined body.

FIG. 9 is a second table used for describing the results of the test for evaluating the joined body.

DETAILED DESCRIPTION OF EXEMPLARY EMBODIMENTS OF THE INVENTION

First Embodiment

FIG. 1 is a perspective view showing the appearance of an electrostatic chuck 1 of a first embodiment. FIG. 2 is an overall sectional view of the electrostatic chuck 1. FIG. 3 is a partial sectional view of the electrostatic chuck 1. The electrostatic chuck 1 of the first embodiment is a holding apparatus which is provided in, for example, an etching apparatus and attracts a wafer W by electrostatic attraction force, thereby holding the wafer W. The electrostatic chuck 1 includes a ceramic member 10, an electrode terminal 15, a lift pin 18, a metal member 20, and a joining layer 30 (see FIG. 3). In the electrostatic chuck 1, the ceramic member 10, the joining layer 30, and the metal member 20 are stacked in this order in the Z-axis direction (vertical direction). In the electrostatic chuck 1, a joined body 1a composed of the ceramic member 10, the joining layer 30, and the metal member 20 is an approximately circular columnar body. In the joined body 1a, the ceramic member 10 and the metal member 20 are joined together via the joining layer 30. The ceramic member 10 corresponds to the "first member" in the claims, and the metal member 20 corresponds to the "second member" in the claims. The wafer W corresponds to the "object to be held" in the claims.

The ceramic member 10 is an approximately circular, plate-shaped member and is formed of alumina ($Al_2O_3$). The diameter of the ceramic member 10 is, for example, about 50 mm to 500 mm (generally, about 200 mm to 350 mm), and the thickness of the ceramic member 10 is, for example, about 1 mm to 10 mm. The ceramic member 10 has a pair of main faces 11 and 12. A placement surface 13 on which the wafer W is placed is formed on the main face 11, which is one of the pair of main faces 11 and 12. The wafer W, which is placed on the placement surface 13, is attracted and fixed to the placement surface 13 by an electrostatic attraction force generated by an electrostatic attraction electrode 100 (see FIGS. 2 and 3) disposed in the ceramic member 10. A recess 14 is formed on the other main face 12. An end portion 15a of an electrode terminal 15 for supplying electric power from an unillustrated power supply to the electrostatic attraction electrode 100 is disposed in the recess 14. Notably, the ceramic material used to form the ceramic member 10 may be aluminum nitride (AlN), zirconia ($ZrO_2$), silicon nitride ($Si_3N_4$), silicon carbide (SiC), yttria ($Y_2O_3$), or the like.

Two through holes 16 and 17 are formed in the ceramic member 10. The through hole 16 extends through the ceramic member 10 in the Z-axis direction, and a lift pin 18 is inserted into the through hole 16. The through hole 17 serves as a flow passage through which helium gas to be supplied between the placement surface 13 and the wafer W flows when the wafer W is placed on the placement surface 13 (see a broken line arrow F1 of FIG. 3).

The metal member 20 is a plate-shaped member having an approximately circular planar shape and is formed of stainless steel. The metal member 20 has a pair of main faces 21 and 22. The diameter of the metal member 20 is, for example, about 220 mm to 550 mm (generally, 220 mm to 350 mm), and the thickness of the metal member 20 is, for example, about 20 mm to 40 mm. A coolant passage 200 is formed in the metal member 20 (see FIG. 2). When a coolant (for example, fluorine-based inert liquid, water, or the like) flows through the coolant passage 200, the ceramic member 10 is cooled via the joining layer 30, whereby the wafer W placed on the ceramic member 10 is cooled. Notably, the type of the metal used to form the metal member 20 may be copper (Cu), aluminum (Al), aluminum alloy, titanium (Ti), titanium alloy, or the like.

Three through holes 23, 24, 25 are formed in the metal member 20. As shown in FIG. 3, each of two through holes 24, 25 extends through the ceramic member 10 in the z-axis direction. The electrode terminal 15 is inserted into the through hole 23. The lift pin 18 is inserted into the through hole 24. The through hole 25 serves as a flow passage through which helium gas to be supplied between the placement surface 13 and the wafer W flows when the wafer W is placed on the placement surface 13.

The joining layer 30 is disposed between the ceramic member 10 and the metal member 20 and joins the ceramic member 10 and the metal member 20 together. The joining layer 30 includes a metal layer 31 and a joining material 32.

The metal layer 31 is disposed between the other main face 11 of the ceramic member 10 and the one main face 21 of the metal member 20. The metal layer 31 is a mesh member having an approximately circular planar shape and formed by weaving a plurality of nickel (Ni) wires into mesh. As a result, a plurality of pores are formed in the metal layer 31. The surfaces of the wires of the mesh member are plated with silver (Ag). The metal layer 31 has a mesh interval of 70 micrometers to 1500 micrometers and a wire dimeter of 50 micrometers to 400 micrometers. In the present embodiment, the mesh member is formed such that a plurality of wires intersect with each other in a plain weave fashion and has a woven mesh structure in which portions of each wire which intersect with other wires located adjacent to the wire are not connected to the other wires. Namely, each of the plurality of wires can change its position relative to adjacent wires. Notably, the metal layer 31 is not limited to the mesh member and may be a porous material such as perforated metal or a mesh structure material such as welded mesh. The material used to form the metal layer 31 is not limited to nickel, and the metal layer 31 may be formed of molybdenum (Mo), tungsten (W), titanium (Ti), aluminum (Al), copper (Cu), brass, an alloy of these metals, or stainless steel. The plating applied to the surfaces of the wires of the mesh member is not limited to silver plating and may be gold (Au) plating or copper plating. Also, the manner of weaving the plurality of wires (i.e., causing the plurality of wires to intersect with each other) to form the mesh member is not limited to the plain weave and may be twill weave or Dutch weave.

Three through holes 31a, 31b, and 31c are formed in the metal layer 31. The through hole 31a establishes communication between the recess 14 of the ceramic member 10 and the through hole 23 of the metal member 20. The through hole 31b establishes communication between the through hole 16 of the ceramic member 10 and the through hole 24 of the metal member 20. The through hole 31c establishes communication between the through hole 17 of the ceramic member 10 and the through hole 25 of the metal member 20. Namely, the through holes 23 and 31a which communicate with each other and the through holes 25 and 31c which communicate with each other are formed in the metal member 20 and the metal layer 31, respectively. The through hole 17, which communicates with the through holes 25 and 31c formed in the metal member 20 and the metal layer 31, respectively, is formed in the ceramic member 10.

The joining material 32 is a joining material containing, as a main component, indium (In) whose surface tension is 1000 mN/m or less at its melting point. Here, the main component of the joining material refers to a component which is one of the components contained in the joining material and which has a weight ratio of 50% or greater with respect to the overall weight of the joining material. The main component of the joining material is identified by using an energy dispersive x-ray spectrometer (EDS) of a scanning electron microscope (SEM). In the present embodiment, the weight ratio of indium with respect to the overall weight of the joining material 32 is 100%. In the joining layer 30, the joining material 32 is located on the ceramic member 10 side of the metal layer 31 and on the metal member 20 side of the metal layer 31 and infiltrates into at least some of the plurality of pores of the metal layer 31. Notably, the main component of the joining material 32 may be a metal whose surface tension is 1000 mN/m or less at its melting point such as zinc (Zn), lead (Pb), or tin (Sn). The surface tension at the melting point is measured by a sessile-drop method for the metal identified by using the above-described EDS.

Next, a method for manufacturing the electrostatic chuck 1 will be described. First, indium foil which becomes the joining material 32 is disposed on each of the other main face 12 of the ceramic member 10 and the one main face 21 of the metal member 20. Next, the metal layer 31 is disposed between the indium foil disposed on the ceramic member 10 and the indium foil disposed on the metal member 20, and the metal layer 31 is sandwiched between the ceramic member 10 and the metal member 20. Finally, the indium foils are melted through application of heat to the indium foils, whereby the ceramic member 10 and the metal member 20 are joined together. At that time, a portion of the molten indium foils enters the pores of the metal layer 31. As a result, the joined body 1a is completed. The electrode terminal 15 and the lift pin 18 are incorporated into the completed joined body 1a, whereby the electrostatic chuck 1 is completed.

In a different method for manufacturing the electrostatic chuck 1, indium foils which become the joining material 32 are disposed on the pair of main faces of the metal layer 31, respectively. The indium foils are melted through application of heat to the metal layer 31 on which the indium foils have been disposed, whereby the joining material 32 is disposed on each of the pair of main faces of the metal layer 31. As a result, the metal layer 31 whose pores have been impregnated with a portion of the joining material 32 is obtained. The metal layer 31 whose pores have been impregnated with a portion of the joining material 32 is disposed between the ceramic member 10 and the metal member 20. A resultant assembly composed of the ceramic member 10, the metal member 20, and the metal layer 31 is pressed while being heated, whereby the ceramic member 10 and the metal member 20 are joined together. As a result, the joined body 1a is completed. The electrode terminal 15 and the lift pin 18 are incorporated into the completed joined body 1a, whereby the electrostatic chuck 1 is completed. Notably, the method for manufacturing the electrostatic chuck 1 is not limited to these methods.

Next, an evaluation test for evaluating the joined body in which two members are joined together via a joining layer will be described. In the present embodiment, samples of the joined body which have different combinations of the metal layer and the joining material of the joining layer were manufactured and, for each sample, oozing of the joining material and joint strength were evaluated.

FIG. 4 is a first view used for describing a method for evaluating oozing of the joining material. FIG. 5 is a second view used for describing the method for evaluating oozing of the joining material. First, evaluation items in the test for evaluating oozing of the joining material will be described. FIGS. 4 and 5 are views used for describing a method for evaluating each sample of the joined body for presence and absence of oozing of the joining material. Sample Sm shown in FIGS. 4 and 5 includes two alumina plates 10a and 20a and a joining layer 30a. As shown in FIGS. 4 and 5, of the two alumina plates 10a and 20a, the alumina plate 10a has a through hole 16a formed therein. FIG. 4 shows a state before the two alumina plates 10a and 20a are joined together by the joining layer 30a, and FIG. 5 shows a state after the two alumina plates 10a and 20a have been joined together by the joining layer 30a.

In the test for evaluating oozing of the joining material, as shown in FIG. 4, the joining layer 30a containing a joining material is disposed between the two alumina plates 10a and 20a. At that time, a hole 35a having an inner dimeter greater than an inner diameter d15 of the through hole 16a is formed in the joining layer 30a (see FIG. 4). As a result, as shown in FIG. 4, an inner wall surface 36a of the joining layer 30a is hidden by the alumina plate 10a. Therefore, in this state, the joining layer 30a cannot be seen through the through hole 16a. Next, Sample Sm is heated so as to melt the joining material of the joining layer 30a, thereby joining the two alumina plates 10a and 20a together. The inner diameter of the hole 35a of the joining layer 30a after the alumina plates 10a and 20a have been joined together is defined as an inner diameter d35 (see FIG. 5). Notably, in the present evaluation test, in the case where the inner wall surface 36a of the joining layer 30a is hidden beneath the alumina plate 10a and cannot be seen even after the alumina plates 10a and 20a have been joined together, it is assumed that the inner diameter d35 of the hole 35a is equal to the inner diameter d15 of the through hole 16a of the alumina plate 10a.

In the test for evaluating oozing of the joining material, oozing of the joining material of the joining layer 30a is evaluated by using the relation between the inner diameter d15 and the inner diameter d35 after the alumina plates 10a and 20a have been joined together. Specifically, evaluation results are represented by symbols as follows.

$d15=d35$:A $0<d15-d35<1$ mm:B $d15-d35=1$ mm or $d15-d35>1$ mm:X

The above-described relation of "d15=d35" means that the joining layer 30a cannot be seen through the through hole 16a of the alumina plate 1a and shows that the joining material has not oozed out from between the two alumina plates 10a and 20a. The above-described relation of "0<d15-d35<1 mm" means that the inner diameter d35 of the hole 35a of the joining layer 30a is slightly (less than 1 mm) smaller than the inner diameter d15 of the through hole 16a of the alumina plate 10a and shows that an acceptable small amount of the joining material of the joining layer 30a has oozed out from between the two alumina plates 10a and 20a. The above-described relation of "d15-d35=1 mm or d15-d35>1 mm" means that, as shown in FIG. 5, the inner diameter d35 of the hole 35a of the joining layer 30a is smaller, by 1 mm or more, than the inner diameter d15 of the through hole 16a of the alumina plate 10a and shows that a large amount of the joining material has oozed out from between the two alumina plates 10a and 20a.

FIG. 6 is a first view used for describing a method for evaluating the joint strength of a joined body. FIG. 7 is a second view used for describing the method for evaluating the joint strength of the joined body. Sample Sm shown in FIGS. 6 and 7 includes two plate-shaped members 10b and 20b formed of silver and a joining layer 30b. The joining layer 30b is disposed to join together first end portions 11b and 21b of the two plate-shaped members 10b and 20b (see FIG. 6). In the present evaluation test, in Sample Sm in which the first end portions 11b and 21b have been joined together by the joining layer 30b, as shown in FIG. 7, second end portions 12b and 22b of the two plate-shaped members 10b and 20b are pulled in opposite directions. In the state shown in FIG. 7, the pulling forces (outline arrows P1 and P2 shown in FIG. 7) applied to the second end portions 12b and 22b of the two plate-shaped members 10b and 20b are increased gradually, and the breaking strength of Sample Sm is determined from the forces at the time when Sample Sm is broken. In the present evaluation test, the determined breaking strength is regarded as joint strength. Specifically, the results of evaluation of the joint strength are represented by symbols as follows. Here, the "interface" refers to the joint interface between each of the plate-shaped members 10b and 20b and the joining layer 30b.

The breaking strength is 1.5 kgf or greater (the joining layer is broken):A

The breaking strength is 1 kgf or greater and less than 1.5 kgf (partial interfacial separation):B+ or B−

B+:The ratio of the area of a separated portion to the total area of the interface is less than 50%.

B−:The ratio of the area of a separated portion to the total area of the interface is 50% or greater.

The breaking strength is less than 1 kgf (interfacial separation):X

In the present evaluation test, oozing of the joining material and joint strength were evaluated by using, as the metal layer having a plurality of pores, perforated metal, welded mesh, and woven mesh. The perforated metal used in the present evaluation test is a member formed of a metal and having a plurality of small holes formed therein. The welded mesh in the present evaluation test is a mesh which is formed by weaving wires formed of a metal and in which the metal wires are connected to each other, by means of welding, in regions where the wires overlap each other. The woven mesh used in the present evaluation test is a mesh which is formed by merely weaving wires and in which the metal wires are not connected to each other in regions where the wires overlap each other.

FIG. 8 is a first table used for describing the results of a test for evaluating the joined body. FIG. 8 shows the results of evaluation of oozing of the joining material and joint strength for combinations of influence factors; i.e., presence and absence of the metal layer, differences in the structure of the metal layer, differences in the material of wires used to form the metal layer, presence and absence of plating of wires, and differences in the manner of weaving of the woven mesh.

The influence of presence and absence of the metal layer in the joining layer will be described by using Sample 1 in which no metal layer is provided in the joining layer and Sample 2 in which a perforated metal is provided in the joining layer. As shown in FIG. 8, in Sample 1, oozing of the joining material (X) and entire surface separation at the joint interface (X) were found. Meanwhile, in Sample 2, it was found that oozing of the joining material is suppressed as compared with Sample 1 (B), and the separation at the joint interface occurs only partially (B−). As a result, it was found that, by virtue of the porous metal layer contained in the joining layer, oozing of the joining material is suppressed and the joint strength is increased.

The influence of the differences in the structure of the metal layer will be described by using Sample 2 in which a perforated metal is provided in the joining layer, Sample 3 in which a welded mesh is provided in the joining layer, and Sample 12 in which a woven mesh is provided in the joining layer. The materials (SUS) used in Samples 2, 3, and 12 are the same. The meshes in Samples 3 and 12 have the same mesh interval (500 micrometers) and the same wire diameter (200 micrometers). As shown in FIG. 8, whereas, in Sample 2 and Sample 3, separation occurred at 50% or more of the joint interface (B−), in Sample 12, separation occurred at less than 50% of the joint interface (B+). From this, it was found that, of the three types of metal layers used in the present evaluation test, the woven mesh is the best in terms of joint strength. Conceivably, this result occurred because, in the woven mesh in which portions of each wire which intersect with other wires located adjacent to the wire are not connected to the other wires, the wires move more easily as compared with the perforated metal and the welded mesh, and therefore, the woven mesh deforms to follow contraction of the joining material, thereby suppressing generation of voids.

The influence of the differences in the material of wires used to form the metal layer will be described by using Samples 3 to 8 in which SUS, aluminum, titanium, molybdenum, tungsten, and silver are used respectively as the material of wires used to form the welded mesh. The meshes in Samples 3 to 8 have the same mesh interval (500 micrometers) and the same wire diameter (200 micrometers). As shown in FIG. 8, it was found that Sample 4 and Sample 5 have increased joint strengths (A) as compared with Sample 3 (B−). Conceivably, this result occurred because the welded mesh is formed of aluminum or titanium which have relatively small Young's moduluses easily deform, and, therefore, the welded mesh deforms to follow contraction of the joining material, thereby suppressing generation of voids. Also, it was found that the degrees of oozing of the joining material in Sample 6 and Sample 7 are smaller (A) as compared with the degree of oozing of the joining material in Sample 3 (B). Conceivably, this result occurred because, in the case where the welded mesh is formed of molybdenum or tungsten which have relatively small coefficients of thermal expansion, the degree of deformation of the metal layer with temperature is small. Furthermore, it was found that Sample 8 including a welded mesh formed of silver has an increased joint strength (A) as compared with Sample 3 (B−).

The influence of presence and absence of plating of wires will be described by using Sample 3 in which the wires used to form the welded mesh are not plated and Samples 9 to 11 in which silver plating, gold plating, and copper plating are performed, respectively, on the surfaces of the wires used to form the welded mesh. The meshes in Samples 3 and 9 to 11 have the same mesh interval (500 micrometers) and the same wire diameter (200 micrometers) and are formed of the same wire material (SUS). As shown in FIG. 8, it was found that Samples 9 to 11 have increased joint strengths (A) as compared with Sample 3 (B−). Conceivably, this result occurred because the wettability of the joining material is enhanced as a result of the surfaces of the wires being plated with silver, gold, or copper. As result, it becomes easier for the joining material to spread over the entire joint interfaces between the plate-shaped members 10b and 20b and the joining layer 30b, whereby generation of voids can be suppressed.

The influence of the differences in the manner of weaving the woven mesh will be described by using Sample 12 in which the woven mesh is woven by plain weave, Sample 13 in which the woven mesh is woven by twill weave, and Sample 14 in which the woven mesh is woven by Dutch weave. As shown in FIG. 8, no significant difference was found among the joint strengths of Samples 12 to 14.

FIG. 9 is a second table used for describing the results of the test for evaluating the joined body. FIG. 9 shows the results of evaluation of oozing of the joining material and joint strength for combinations of influence factors; i.e., presence and absence of plating of wires used to form the woven mesh, differences in plating material, differences in mesh interval, differences in the diameter of the wires, differences in the material of the wires, and differences in the material of brazing filler metal.

The influence of presence and absence of plating of wires and the differences in plating material will be described by using Sample 15 including a woven mesh in which the surfaces of the wires are not plated, Sample 16 including a woven mesh in which the surfaces of the wires are plated with silver, Sample 17 including a woven mesh in which the surfaces of the wires are plated with gold, and Sample 18 including a woven mesh in which the surfaces of the wires are plated with copper. The woven meshes in Samples 15 to 18 have the same mesh interval (500 micrometers) and the same wire diameter (200 micrometers) and are formed of the same wire material (molybdenum). As shown in FIG. 9, in each of Samples 15 to 18, oozing of the joining material was not found (A). Meanwhile, it was found that Samples 16 to 18 have larger joint strengths as compared with Sample 15 and their joining layers are broken before occurrence of separation at the joint interface (A). Conceivably, this result occurred because, in each of Samples 16 to 18, the wettability of the joining material is enhanced as a result of the surfaces of wires being plated with silver, gold, or copper, as described above. As result, in Samples 16 to 18, the joining material spreads more easily over the entire joint interfaces between the plate-shaped members 10b and 20b and the joining layer 30b, as compared with Sample 15, whereby generation of voids can be suppressed. Accordingly, it was found that, when the surfaces of the wires of the woven mesh are plated with silver, gold, or cooper, the strength of joint between the plate-shaped member 10b and the joining layer 30b and the strength of joint between the plate-shaped member 20b and the joining layer 30b increase further.

The influence of the differences in mesh interval will be described by using Samples 16 and 19 to 24 having different mesh intervals. While Sample 16 (wire diameter: 200 micrometers) having a mesh interval of 500 micrometers was used as a reference, Samples 19 to 24 were made such that they have the same wire diameter as Sample 16 and have different mesh intervals in a range of 50 micrometers to 1700 micrometers. As shown in FIG. 9, in Samples 20 to 23 having mesh intervals of 70 micrometers, 100 micrometers, 1000 micrometers, and 1500 micrometers, respectively, oozing of the joining material was not found (A), and it was found that the joining layer 30b is broken before occurrence of separation at the joint interface (A). Meanwhile, it was found that Sample 19 having a mesh interval of 50 micrometers and Sample 24 having a mesh interval of 1700 micrometers have joint strengths lower than those of Samples 20 to 23 because of partial separation at the joint interface (B+). When the mesh interval becomes 50 micrometers as in the case of Sample 19, since it becomes difficult for the joining material entering the pores of the metal layer to move within the metal layer, the joining material becomes less likely to spread over the entire joint interface. Also, when the mesh interval becomes 1700 micrometers as in the case of Sample 24, voids become more likely to be generated in the joining layer, whereby the joint strength decreases. From comparison among Samples 16 and 19 to 24, it was found that, when the mesh interval of the woven mesh is set to fall within the range of 70 micrometers to 1500 micrometers, the strength of joint between the plate-shaped member 10b and the joining layer 30b and the strength of joint between the plate-shaped member 20b and the joining layer 30b increase.

The influence of the diameter of wires will be described by using Samples 16 and 25 to 29 which differ from one another in the diameter of wires. While Sample 16 (mesh interval: 500 micrometers) having a wire diameter of 200 micrometers was used as a reference, Samples 25 to 29 were made such that they have the same mesh intervals as Sample 16 and have different wire diameters in a range of 30 micrometers to 450 micrometers. As shown in FIG. 9, in Samples 26 to 28 having wire diameters of 50 micrometers, 150 micrometers, and 400 micrometers, respectively, oozing of the joining material was not found (A), and it was found that the joining layer 30b is broken before occurrence of separation at the joint interface (A). Meanwhile, in Sample 25 having a wire diameter of 30 micrometers and Sample 29 having a wire diameter of 450 micrometers, it was found that partial separation occurs at the joint interface (B). When the wire diameter becomes 30 micrometers as in the case of Sample 25, the effect of stopping flow of the joining material by the metal layer becomes weaker, and the joining material becomes more likely to ooze from the pores of the metal layer. Also, when the wire diameter becomes 450 micrometers as in the case of Sample 29, the effect of stopping flow of the joining material by the metal layer becomes excessively strong, and the joining material becomes less likely to spread over the entire joint interfaces. From comparison among Samples 16 and 25 to 29, it was found that, when the wire diameter is set to fall within the range of 50 micrometers to 400 micrometers, the strength of joint between the plate-shaped member 10b and the joining layer 30b and the strength of joint between the plate-shaped member 20b and the joining layer 30b increase.

The influence of the differences in the material of the wires used to form the woven mesh will be described by using Sample 16 in which the wires of the woven mesh are formed of molybdenum and Sample 30 in which the wires of the woven mesh are formed of tungsten. Samples 16 and 30 have the same mesh interval (500 micrometers) and the same wire diameter (200 micrometers) and use the same plating material (silver). As shown in FIG. 9, no significant difference was found between Sample 16 and Sample 30, in which different materials are used for the wires, in terms of oozing of the joining material and joint strength.

The influence of the differences in the material of the brazing filler metal will be described by using Sample 31 and Sample 32 which include joining materials different from indium used in Sample 16. In Sample 31, the plate-shaped members 10b and 20b are joined together by a joining material formed of a SnAgCu alloy which contains tin (Sn), silver (Ag), and copper (Cu) at a composition ratio of 1:3:0.5. In Sample 32, the plate-shaped members 10b and 20b are joined together by a joining material formed of a PbSn alloy which contains lead (Pb) and tin at a composition ratio of 1:5. In Sample 31 and Sample 32, the surfaces of the wires of the woven mesh are plated with silver. In both of Sample 18 and Sample 19, oozing of the joining material was not found (A), and it was found that the joining layer 30b is broken before occurrence of separation at the joint interface (A).

According to the above-described joined body 1a of the present embodiment, at least some of the pores of the metal layer 31 are impregnated with the joining material 32 which contains, as a main component, indium whose surface tension is 1000 mN/m or less at its melting point. The joining material 32 which contains indium as a main component has a high degree of flowability when melted. In the joining layer 30, the joining material 32 enters the pores of the metal layer 31 while spreading over the entire joint interface between the ceramic member 10 and the joining layer 30 and over the entire joint interface between the metal member 20 and the joining layer 30. As a result, the joining material 32 becomes less likely to ooze from between the ceramic member 10 and the metal member 20. Since oozing of the joining material 32 from between the ceramic member 10 and the metal member 20 is suppressed, a decrease in the strength of joint between the ceramic member 10 and the metal member 20 can be suppressed.

Also, according to the joined body 1a of the present embodiment, when, as shown in FIGS. 8 and 9, the metal layer 31 is formed of a material which contains molybdenum or tungsten as a main component, the degree of thermal expansion of the metal layer 31 becomes relatively small. As a result, even when the joined body 1a is heated when the ceramic member 10 and the metal member 20 are joined together or the electrostatic chuck 1 is used, the metal layer deforms to a small degree. Accordingly, oozing of the joining material 32 can be suppressed stably, and, therefore, a decrease in the strength of joint between the ceramic member 10 and the metal member 20 can be suppressed further.

Also, according to the joined body 1a of the present embodiment, when, as shown in FIG. 8, the metal layer 31 is formed of a material which contains aluminum or titanium as a main component, the Young's modulus of the metal layer 31 becomes relatively small, and it becomes easier for the metal layer 31 to deform. As a result, when the electrostatic chuck 1 is cooled, since the metal layer 31 deforms to follow contraction of the joining material 32, generation of voids can be suppressed. Accordingly, a decrease in the strength of joint between the ceramic member 10 and the metal member 20 due to generation of voids can be suppressed further.

Also, according to the joined body 1a of the present embodiment, silver plating is applied to the surfaces of the wires of the metal layer 31, which is a mesh member formed of nickel. Namely, the surfaces of the wires of the mesh member are formed of a material which contains silver as a main component. As a result, the wettability of the joining material 32 with respect to the metal layer 31 is improved. Therefore, the joining material 32 becomes more likely to spread over the entire joint interface between the ceramic member 10 and the joining layer 30 and over the entire joint interface between the metal member 20 and the joining layer 30, whereby generation of voids is suppressed further. Accordingly, the strength of joint between the ceramic member 10 and the metal member 20 can be increased further.

Also, according to the joined body 1a of the present embodiment, the metal layer 31 is a mesh member having an approximately circular planar shape and is formed such that the plurality of wires of the mesh member intersect with each other in a plain weave fashion. The metal layer 31 has a woven mesh structure in which portions of each wire which intersect with other wires located adjacent to the wire are not connected to the other wires. As a result, the wires move easily as compared with a perforated metal and a welded mesh in which portions of each wire which intersect with other wires located adjacent to the wire are connected to the other wires. Therefore, for example, when the electrostatic chuck 1 is cooled, the metal layer 31 easily deforms to follow contraction of the joining material 32. Accordingly, generation of voids can be suppressed, and therefore, a decrease in the strength of joint between the ceramic member 10 and the metal member 20 can be suppressed further.

Also, according to the joined body 1a of the present embodiment, the mesh interval of the metal layer 31, which is a mesh member formed of nickel, is 70 micrometers to 1500 micrometers. When the mesh interval becomes smaller than 70 micrometers, since it becomes difficult for the joining material entering the pores of the porous body to move within the metal layer, the joining material becomes less likely to spread over the entire joint interfaces. Also, when the mesh interval becomes greater than 1500 micrometers, voids become more likely to be generated in the joining layer, whereby the joint strength decreases. In the joined body 1a in which the joining layer 30 includes the metal layer 31 whose mesh interval is 70 micrometers to 1500 micrometers, it is possible to suppress a decrease in the joint strength due to generation of voids, while spreading the joining material 32 over the entire joint interface between the ceramic member 10 and the joining layer 30 and over the entire joint interface between the metal member 20 and the joining layer 30. As a result, the strength of joint between the ceramic member 10 and the metal member 20 can be increased further.

Also, according to the joined body 1a of the present embodiment, the wires of the metal layer 31, which is a mesh member formed of nickel, have a diameter of 50 micrometers to 400 micrometers. When the wire diameter becomes smaller than 50 micrometers, the effect of stopping flow of the joining material by the metal layer becomes weaker, and the joining material becomes more likely to ooze from the pores of the metal layer. Also, when the wire diameter becomes greater than 400 micrometers, the effect of stopping flow of the joining material by the metal layer becomes excessively strong, and the joining material becomes less likely to spread over the entire joint interfaces. In the joined body 1a in which the metal layer 31 whose wires have a diameter of 50 micrometers to 400 micrometers is provided in the joining layer 30, it is possible to spread the joining material 32 over the entire joint interfaces properly. As a result, it is possible to suppress generation of voids while suppressing oozing of the joining material 32 from between the ceramic member 10 and the metal member 20, thereby further increasing the strength of joint between the ceramic member 10 and the metal member 20.

Also, in general, when the thickness of the joining layer is increased, the amount of the joining material necessary to secure the strength of joint between the two members increases. Therefore, in the case where an expensive metal such as indium is used, the production cost of the joined body increases. In the joined body 1a of the present embodiment, since the thickness of the joining layer 30 can be made relatively small by setting the diameter of the wires of the metal layer 31 to 400 micrometers or less, the amount of the joining material 32 to be used can be reduced, whereby the production cost of the joined body 1a can be reduced.

Also, when the thickness of the joining layer is increased, since the distance between the two members increases, the thermal conductivity of the joining layer decreases. For example, when heat is transferred from one member to the other member as in the case of the holding apparatus of the present embodiment, there is a possibility that heat cannot be transferred efficiently via the joining layer. In the joined body 1a of the present embodiment, since the thickness of the joining layer 30 can be made relatively small by setting the diameter of the wires of the metal layer 31 to 400 micrometers or less, a decrease in the thermal conductivity of the joining layer 30 can be suppressed. Accordingly, heat can be transferred efficiently from the ceramic member 10 to the metal member 20.

Also, according to the joined body 1a of the present embodiment, the joining material 32 contains indium as a main component. Therefore, the ceramic member 10 and the metal member 20 can be joined together at a relatively low temperature. Since the ceramic member 10 and the metal member 20 can be joined together at a relatively low temperature, a joined body 1a which is suitable for use at low temperature can be obtained.

Also, according to the electrostatic chuck 1 of the present embodiment, in the joined body 1a, oozing of the joining material 32 from between the ceramic member 10 and the metal member 20 is suppressed, and the strength of joint between the ceramic member 10 and the metal member 20 can be increased. As a result, it is possible to suppress occurrence of an insulation failure of the electrode terminal 15 due to leakage of the joining material 32 into the through hole 31a which is formed in the joined body 1a and in which the electrode terminal 15 is disposed. Also, it is possible to suppress occurrence of an operation failure of the lift pin 18 due to leakage of the joining material 32 into the through hole 31b in which the lift pin 18 is disposed. Also, it is possible to suppress clogging of the through hole 31c due to leakage of the joining material 32 into the through hole 31c through which helium gas is supplied to the placement surface 13. Accordingly, it is possible to prevent loss of functions of the electrostatic chuck 1.

MODIFICATIONS OF THE PRESENT EMBODIMENT

The present invention is not limited to the above-described embodiment and can be practiced in various forms without departing from the gist of the invention, and, for example, the following modifications are possible.

Modification 1

In the above-described embodiment, the "joined body" includes the ceramic member 10 and the metal member 20. However, the combination of members which constitute the "joined body" is not limited thereto. For example, the joined body may be a joined body in which ceramic members are joined together or a joined body in which metal members are joined together. Further, the joined body may be formed by using materials other than ceramic materials and metals. For example, the joined body may be formed by using glass, glass epoxy, resin (e.g., thermoplastic resin, thermosetting resin, etc.), paper phenol, paper epoxy, glass composite, and a metal member with any of these insulating members formed on the surface.

Modification 2

In the above-described embodiment, the metal layer 31 is a mesh member formed such that wires formed of nickel (Ni) intersect with each other in a plain weave fashion. However, the metal layer 31 is not limited thereto. The metal layer 31 may be formed of a porous material, a mesh structure material, or felt composed of metal fibers. Also, the manner of weaving a plurality of wires for forming the mesh member is not limited to plain weave and may be twill weave or Dutch weave. The material used to form the metal layer 31 is not limited to nickel. The metal layer 31 may be formed of a metal such as molybdenum (Mo), tungsten (W), titanium (Ti), aluminum (Al), copper (Cu), brass, an alloy of these metals, or stainless steel, or a material other than metals.

Modification 3

In the above-described embodiment, in the metal layer 31, the surfaces of the wires which constitute the mesh member are plated with silver. However, the surfaces of the wires of the mesh member may be formed of a material which contains silver as a main component, or the mesh member itself may be formed of silver. Also, the material which contains silver as a main component may not be formed on the surface of the mesh member, and a material which contains gold or copper as a main component may be formed on the surface of the mesh member. In this case, the mesh member itself may be formed of gold or copper. Also, the surface of the mesh member may not be formed of a material which contains a metal as a main component.

Modification 4

In the above-described embodiment, the metal layer 31 has a mesh interval of 70 micrometers to 1500 micrometers and a wire diameter of 50 micrometers to 400 micrometers. However, the mesh interval and wire diameter of the mesh member are not limited thereto. Since, by setting the mesh interval to fall within the range of 70 micrometers to 1500 micrometers, it becomes possible to suppress generation of voids while spreading the joining material 32 over the entire joint interfaces, the joint strength can be increased. Also, when the diameter of the wires is set to fall within the range of 50 micrometers to 400 micrometers, oozing of the joining material 32 is stopped properly by the metal layer 31, whereby the joint strength can be increased.

Modification 5

In the above-described embodiment, the ratio of the weight of indium to the overall weight of the joining material 32 is 100%. However, the weight ratio of indium is not limited thereto. It is sufficient that the ratio of the weight of indium to the overall weight of the joining material 32 is 50% or greater. Also, the weight ratio of indium is not necessarily required to be 50% or greater, and the surface tension of the joining material 32 itself at the melting point may be 1000 mN/m or less. Also, the main component of the joining material is not limited to indium. The main component of the joining material may be a metal whose surface tension at the melting point is 300 mN/m or greater and 1000 mN/m or less; for example, zinc, lead, tin, or the like.

Modification 6

In the above-described embodiment, the electrostatic chuck 1 is provided in an etching apparatus. However, the field of application of the electrostatic chuck 1 is not limited thereto. The electrostatic chuck 1 may be used to, for example, fix, correct, or transfer wafers in a semiconductor manufacturing apparatus. Furthermore, the apparatus which has the "holding apparatus" including the joined body 1a is not limited to the electrostatic chuck and may be used as a placement table or a susceptor of, for example, a CVD (Chemical Vapor Deposition) apparatus, a PVD (Physical Vapor Deposition) apparatus, or a PLD (Pulsed Laser Deposition) apparatus. Accordingly, the force for holding an object to be held is not limited to electrostatic attraction force.

Modification 7

In the above-described embodiment, the joined body may include an additional layer such as a metal layer between the ceramic member and the joining layer and/or between the metal member and the joining layer. This additional layer may be a layer formed as a result of vaporization of titanium in the joining material which forms the joining layer, or a metallization layer formed beforehand.

Modification 8

In the above-described embodiment, the laminate composed of the ceramic member 10, the joining layer 30, and the metal member 20 has an approximately circular columnar shape. However, the shape of the "joined body" is not limited thereto. For example, the joined body may have a rectangular shape, a polygonal shape, etc.

Although the present aspects have been described on the basis of embodiments and modifications, the above-described embodiments of the aspects are provided so as to facilitate the understanding of the present aspects and do not limit the present aspects. The present aspects can be changed or improved without departing from the purpose of the aspects and the claims, and encompass equivalents thereof. Also, the technical feature(s) may be eliminated as appropriate unless the present specification mentions that the technical feature(s) is mandatory.

DESCRIPTION OF REFERENCE SIGNS

1: electrostatic chuck
1a: joined body
10: ceramic member
13: placement surface
20: metal member
30: joining layer
31: metal layer
32: joining material
W: wafer

The invention claimed is:

1. A joined body in which a first member and a second member are joined together via a joining layer, wherein
the joining layer includes
a joining material which contains, as a main component, a metal having a surface tension of 1000 mN/m or less at its melting point, and
a metal layer which has a plurality of pores formed therein and in which at least some of the pores are impregnated with the joining material.

2. The joined body according to claim 1, wherein the metal layer is formed of a material which contains molybdenum or tungsten as a main component.

3. The joined body according to claim 1, wherein the metal layer is formed of a material which contains aluminum or titanium as a main component.

4. The joined body according to claim 1, wherein
the metal layer is a mesh member, and
surfaces of wires of the mesh member are formed of a material which contains gold, silver, or copper as a main component.

5. The joined body according to claim 1, wherein
the metal layer is a mesh member formed such that a plurality of wires intersect with each other in a plain weave fashion, a twill weave fashion, or a Dutch weave fashion, and
portions of each wire which intersect with other wires located adjacent to the wire are not connected to the other wires.

6. The joined body according to claim 1, wherein
the metal layer is a mesh member, and
the mesh member has a mesh interval of 70 to 1500 micrometers.

7. The joined body according to claim 1, wherein
the metal layer is a mesh member, and
wires of the mesh member have a diameter of 50 to 400 micrometers.

8. The joined body according to claim 1, wherein
the joining material contains indium as a main component.

9. A holding apparatus comprising the joined body according to claim 1, wherein the first member has a placement surface on which an object to be held is placed.

10. An electrostatic chuck comprising the holding apparatus according to claim 9, wherein the first member has an electrostatic attraction electrode disposed therein.

11. The joined body according to claim 2, wherein
the metal layer is a mesh member, and
surfaces of wires of the mesh member are formed of a material which contains gold, silver, or copper as a main component.

12. The joined body according to claim 3, wherein
the metal layer is a mesh member, and
surfaces of wires of the mesh member are formed of a material which contains gold, silver, or copper as a main component.

13. The joined body according to claim 2, wherein
the metal layer is a mesh member formed such that a plurality of wires intersect with each other in a plain weave fashion, a twill weave fashion, or a Dutch weave fashion, and
portions of each wire which intersect with other wires located adjacent to the wire are not connected to the other wires.

14. The joined body according to claim 3, wherein
the metal layer is a mesh member formed such that a plurality of wires intersect with each other in a plain weave fashion, a twill weave fashion, or a Dutch weave fashion, and
portions of each wire which intersect with other wires located adjacent to the wire are not connected to the other wires.

15. The joined body according to claim 4, wherein
the metal layer is a mesh member formed such that a plurality of wires intersect with each other in a plain weave fashion, a twill weave fashion, or a Dutch weave fashion, and
portions of each wire which intersect with other wires located adjacent to the wire are not connected to the other wires.

16. The joined body according to claim 2, wherein
the metal layer is a mesh member, and
the mesh member has a mesh interval of 70 to 1500 micrometers.

17. A joined body according to claim 2, wherein
the metal layer is a mesh member, and
wires of the mesh member have a diameter of 50 to 400 micrometers.

18. The joined body according to claim 2, wherein
the joining material contains indium as a main component.

19. A holding apparatus comprising the joined body according to claim 2, wherein the first member has a placement surface on which an object to be held is placed.

20. An electrostatic chuck comprising the holding apparatus according to claim 19, wherein the first member has an electrostatic attraction electrode disposed therein.

* * * * *